(12) United States Patent
Funakoshi et al.

(10) Patent No.: US 7,819,594 B2
(45) Date of Patent: Oct. 26, 2010

(54) DEVELOPMENT PROCESSING DEVICE

(75) Inventors: Hideo Funakoshi, Koshi (JP); Masahito Hamada, Koshi (JP); Yoshiki Okamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 478 days.

(21) Appl. No.: 12/007,268

(22) Filed: Jan. 8, 2008

(65) Prior Publication Data

US 2008/0176172 A1  Jul. 24, 2008

(30) Foreign Application Priority Data

Jan. 19, 2007 (JP) ............................. 2007-010694

(51) Int. Cl.
*G03D 5/00* (2006.01)
*H01L 21/00* (2006.01)
*G03F 7/00* (2006.01)
(52) U.S. Cl. ...................... 396/611; 430/313; 118/300
(58) Field of Classification Search ................ 396/611, 396/627; 430/311, 313, 322; 118/52, 300
See application file for complete search history.

(56) References Cited

U.S. PATENT DOCUMENTS

| 7,419,316 | B2* | 9/2008 | Kitamura et al. | 396/611 |
| 2003/0044731 | A1* | 3/2003 | Yoshihara et al. | 430/325 |
| 2003/0077083 | A1* | 4/2003 | Yamamoto et al. | 396/611 |
| 2003/0165756 | A1* | 9/2003 | Ono et al. | 430/30 |
| 2004/0053147 | A1* | 3/2004 | Ito | 430/30 |

FOREIGN PATENT DOCUMENTS

JP   2005-236189   9/2005

OTHER PUBLICATIONS

Translation of JP 2005-236189 (dated Sep. 2, 2005).*

* cited by examiner

*Primary Examiner*—Alan A Mathews
(74) *Attorney, Agent, or Firm*—Smith, Gambrell & Russell, LLP (57) ABSTRACT

A device includes a rotary base; an approach stage; a substrate holding table and a nozzle head. The substrate holding table holds the work by suction, and comes into intimate contact with the approach stage and the rotary base through first and second annular seal members to form a liquid storage space, respectively. When the suction holding and the intimate contact are released, the substrate becomes rotatable together with the rotary base and the approach stage.

20 Claims, 10 Drawing Sheets

DEVELOPMENT PROCESSING DEVICE

BACKGROUND OF THE INVENTION

1. Field of the Invention

The invention relates to a development processing device that supplies a liquid developer onto a glass substrate for photomask such as a reticle.

2. Description of the Background Art

For example, a photolithography step in a manufacturing process of a semiconductor device or a substrate such as a reticle is generally executed by performing processing such as resist application processing of forming a resist film by applying a resist liquid onto the substrate, exposure processing of performing exposure on the resist film on the substrate to form a predetermined pattern, and development processing of developing the resist film on the substrate by supplying a liquid developer onto the exposed substrate.

In this kind of conventional development processing device, a nozzle head discharges and aspirates a liquid developer, and therefore may cause a so-called air-biting phenomenon in which an ambient air is mixed into the liquid developer. A device for preventing this phenomenon is already known. This device includes an outer peripheral plate such as an approach stage that is rotatable together with a rotatable rotary base, and surrounds an outer periphery of a substrate held by a substrate holding member. This approach stage is employed for forming a liquid film that extends continuously over the surface of the substrate and its surface flush with the surface of the substrate.

In view of transfer of the substrate, a space is formed between the substrate and the outer peripheral plate. Therefore, a liquid may flow out through the space when the liquid film is being formed on the surfaces of the substrate and the approach stage. For preventing this problem, a development processing device disclosed in Japanese Patent Laying-Open No. 2005-236189 has a substrate holding member holding, by suction, the substrate in such a state that the substrate holding member is in intimate contact with a rear surface of an outer peripheral portion of the substrate throughout the circumference of the outer peripheral portion of the substrate. The substrate holding member is further configured such that a part of the substrate holding member opens to a space between it and the outer side surface of the substrate, and thereby forms a groove in which the liquid is kept.

In this kind of conventional development processing device, however, the rear surface of the substrate is always in contact with the substrate holding member during the processing so that it is impossible to wash contact portions of the rear substrate surface and the substrate holding member. Also, a part of the substrate holding member surrounds the substrate for holding the liquid film so that residues of the liquid developer may remain on that portion, and may contaminate the substrate. Since a suction line must be attached to a rotary unit, it is difficult to arrange the suction line inside the rotary base and the substrate holding member and to provide a sealing structure between the rotary and unrotary units. Since a seal member for such sealing is generally formed of, e.g., an O-ring, a complicated seal adjustment is required for applying a uniform pressure to the O-ring, and further the O-ring must be periodically replaced. Further, the rotary base and the substrate holding member are simultaneously rotated. Therefore, the rotary unit has a large weight and requires a motor of a large power. Also, a mechanism is required for removing heat generated by friction of the O-ring.

SUMMARY OF THE INVENTION

An object of the invention is to provide a development processing device that does not cause insufficient washing of the rear surface of the substrate and contamination of the substrate, has a suction line and a sealing unit of simple structures and can reduce a required drive power.

A development processing device according to the invention includes a rotary base rotatably holding a work substrate; an outer peripheral plate arranged for rotation together with the rotary base and surrounding an outer periphery of the work substrate held by the rotary base; a substrate holding table arranged vertically movably with respect to the rotary base for holding the work substrate by suction; and a nozzle head arranged movably along a surface of the work substrate held by the substrate holding table for simultaneously performing supply and aspiration of a liquid developer with respect to the work substrate. A top surface of the outer peripheral plate is flush with or slightly higher in level than a top surface of the work substrate. When the substrate holding table is holding the work substrate by suction, the substrate holding table is in intimate contact with the outer peripheral plate and the rotary base with a seal member interposed therebetween, such that a liquid storage space is formed for forming a liquid film continuously extending over the top surface of the outer peripheral plate and the top surface of the work substrate. When the suction holding and the intimate contact are released, the work substrate is rotatable together with the rotary base and the outer peripheral plate.

According to the above structure, during the development processing, the substrate holding table holds the work substrate (i.e., substrate to be processed) by suction, the substrate holding table is in intimate contact with the outer peripheral plate and the rotary base with a seal member interposed therebetween to form the liquid storage space. This liquid storage space can store the liquid to from the liquid film continuously extending over the surfaces of the work substrate and the outer peripheral plate. When the suction holding and the intimate contact are released, the work substrate is rotated together with the rotary base and the outer peripheral plate so that various portions including the rear surface of the substrate can be washed and dried. Accordingly, insufficient washing of the rear substrate surface and the substrate contamination can be prevented. Also, a suction line and a sealing unit can have simple structures, and a required drive power can be reduced.

Preferably, the development processing device further includes a washing liquid supply device supplying a washing liquid toward the rotary base, the work substrate held by the substrate holding table and the liquid storage space.

According to this structure, the washing liquid supply device can form the liquid film in the development processing, and can supply the washing liquid in the washing processing. Consequently, the efficiency of the development processing and washing processing can be improved.

Preferably, in the above development processing device, the substrate holding table includes a first annular seal member being intimately contactable with the rear surface of the outer peripheral plate throughout its circumference, a second annular seal member being intimately contactable with the rear surface of the rotary base throughout its circumference, and a suction holding unit making intimate contact with the rear surface of the work substrate and holding the work substrate by suction.

Preferably, in the above development processing device, the first and second annular seal members have flexible seal pieces obliquely extending toward the intimate contact targets formed of the rear side of the outer peripheral plate and the rear side of the rotary base, respectively.

According to the above structure, the substrate holding table holds the work substrate by suction, comes into intimate contact with the rear surface of the outer peripheral plate throughout its circumference with the first annular seal member interposed therebetween and comes into intimate contact with the rear surface of the rotary base throughout its circumference with the second annular seal member interposed therebetween so that the liquid storage space having high watertightness can be formed. Therefore, the efficiency of the development processing can be improved. By forming the seal piece at each of the first and second annular seal member as described above, it is possible to increase the contact area of the sealing unit as compared with an O-ring, and the adjustment thereof can be performed more easily.

Preferably, in the above development processing device, the substrate holding table includes a cylindrical body having a closed end and a through hole for rotatably inserting a rotation shaft of the rotary base, and a suction holding unit projected from a bottom of the body, and having a suction port at its top surface for drawing the work substrate by suction. The first annular seal member is arranged on a top surface of a side wall of the body, and the second annular seal member is arranged on an edge of the through hole at the bottom of the body.

Preferably, in the above development processing device, a suction port forming portion of the suction holding unit is horizontally flat, and a top surface of the suction holding unit except for the suction port forming portion is inclined to diverge downward from inside toward outside in a radial direction of the substrate holding table.

According to the above structure, a space between the rotary unit, i.e., the rotary base and the unrotary unit, i.e., the substrate holding table can be easily and reliably sealed. Since the suction port forming portion of the suction holding unit is horizontally flat, and the top surface of the suction holding unit except for the suction port forming portion is inclined to diverge downward from inside edge toward outside edge, a liquid adhering to the top surface of the suction holding unit can be easily drained off therefrom. Therefore, it is possible to prevent, e.g., such a situation that the liquid remaining after the washing processing adheres to the rear surface of the substrate again.

Preferably, in the above development processing device, the substrate holding table is provided at its bottom with a drain port, and a bottom surface of the substrate holding table is inclined downward toward the drain port.

According to this structure, the liquid stored in the liquid storage space can be discharged through the drain port formed at the bottom of the substrate holding table, and the liquid adhering to the bottom can be easily drained off from the bottom. Therefore, it is possible to prevent reliably, e.g., such a situation that the liquid remaining after the washing processing adheres to the rear surface of the substrate again.

Preferably, in the above development processing device, a vibrator is arranged on a lower surface of a bottom defining the liquid storage space of the substrate holding table, and an ultrasonic generator is connected to the vibrator.

According to the above structure, when the work substrate is washed, the ultrasonic generator applies a radio-frequency voltage of an appropriate frequency to the vibrator to excite it. Thereby, the ultrasonic vibration occurs, and is propagated through the liquid stored in the liquid storage space to remove the liquid developer adhering to the rear surface of the substrate. Accordingly, the washing efficiency can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the invention will now be described in detail with reference to the accompanying drawings. In the embodiments to be described below, a development processing device according to the invention is applied to a development processing devices that performs development processing on a work substrate (i.e., a substrate to be processed) for a photomask such as a glass substrate for a reticle.

Figure 1:
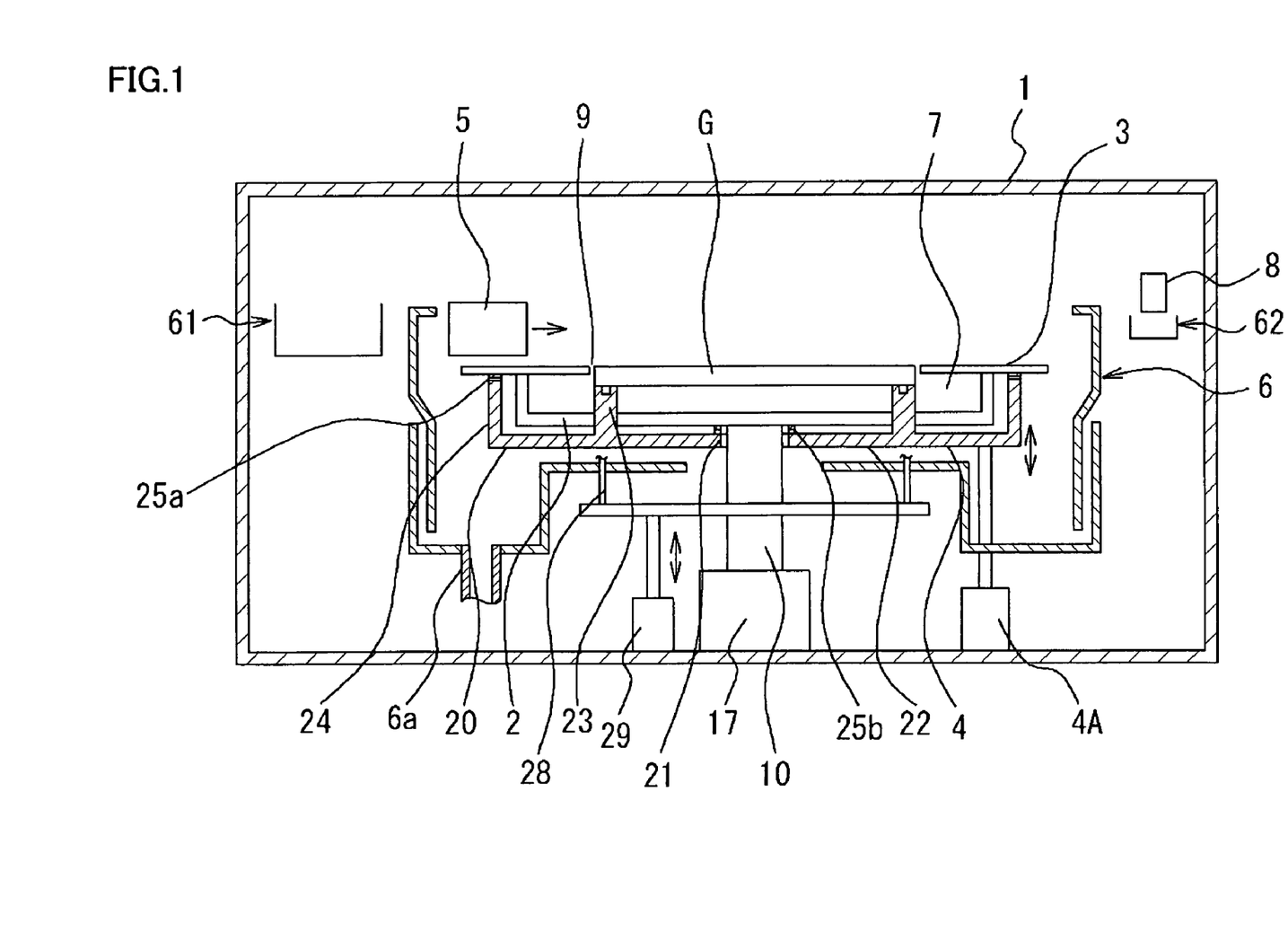
FIG. 1 is a schematic cross section showing a first embodiment of a development processing device according to the invention.
Figure 2:
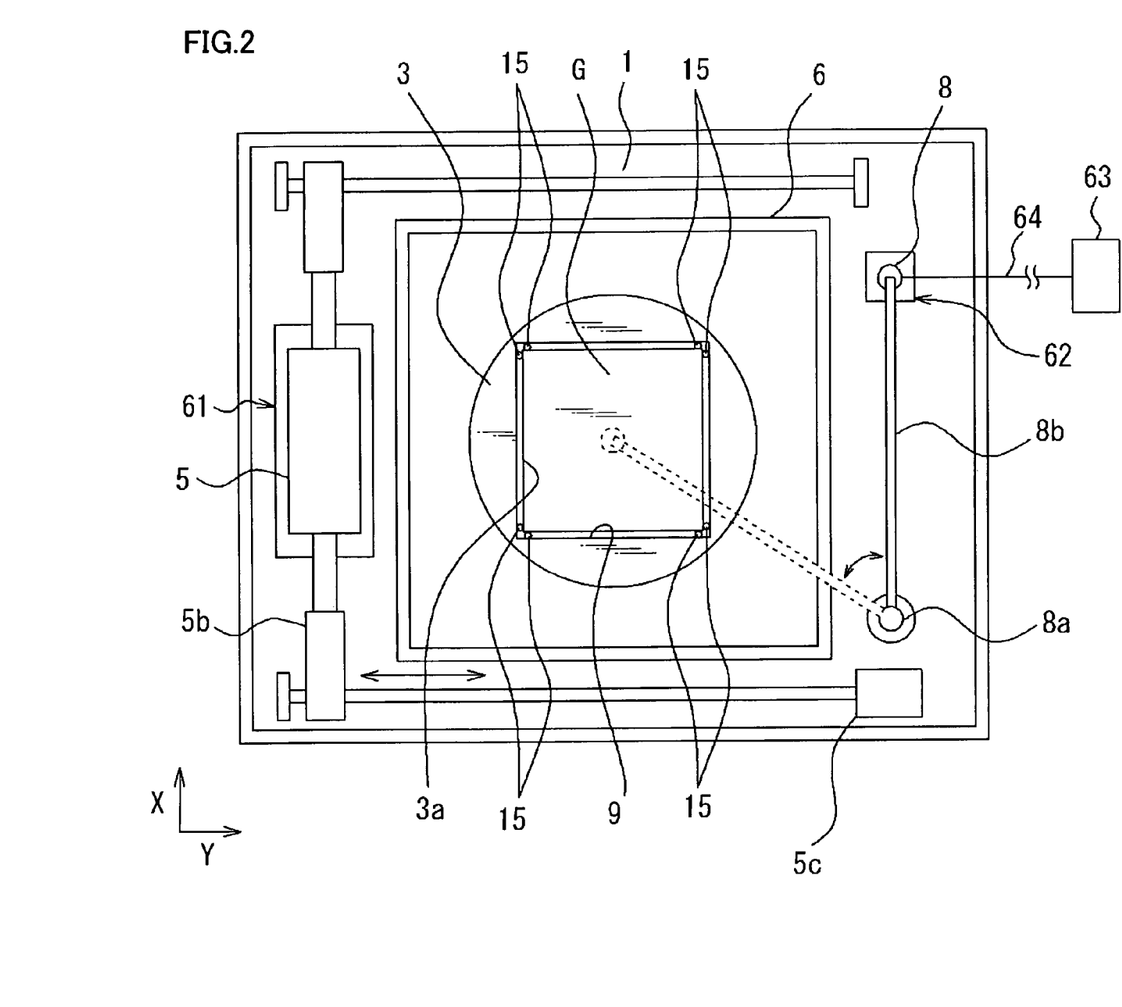
FIG. 2 is a plan of the development processing device.

FIG. 1 is a schematic cross section showing a first embodiment of the development processing device according to the invention, and FIG. 2 is a schematic plan of the development processing device.

The development processing device according to the invention has a casing 1. In casing 1, the development processing device has a rotary base 2 for rotatably holding a glass substrate G (which will be simply referred to as "substrate G" hereinafter), an outer peripheral plate 3 (which will be referred to as an "approach stage 3" hereinafter) that surrounds the outer periphery of substrate G held on rotary base 2 for forming a liquid film continuously extending over its surface flush with a surface of substrate G and the surface of substrate G, a substrate holding table 4 that is arranged vertically movably with respect to rotary base 2 for holding substrate G by suction, and a nozzle head 5 that is movable along the surface of substrate G held on substrate holding table 4 and can simultaneously supply and aspirate a liquid developer with respect to substrate G.

Rotary base 2, approach stage 3 and substrate holding table 4 can be accommodated in a cup 6. A washing liquid supply device 8 is arranged outside cup 6 for supplying a washing liquid (i.e., rinse liquid) such as pure water toward rotary base 2, substrate G held on and substrate holding table 4 and a liquid storage space 7 to be described later.

Figure 4A:
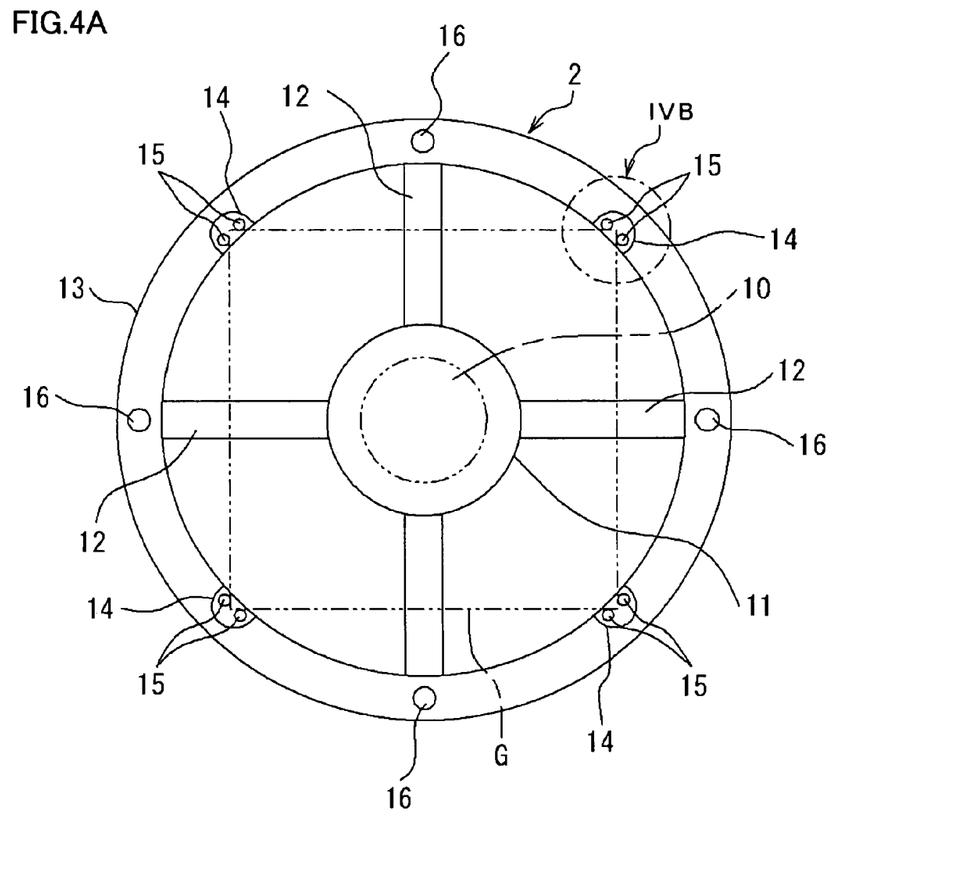
FIGS. 4A and 4B are a plan showing a rotary base in the invention and a perspective view showing, on an enlarged scale, an IVB portion in FIG. 4A, respectively.
Figure 4B:
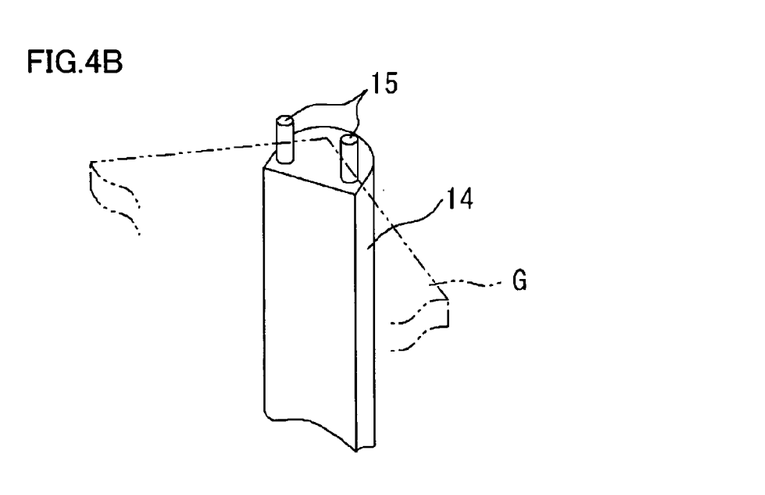

In the above structure, as shown in FIGS. 4A and 4B, rotary base 2 is formed of a disk-like base portion 11 coupled to a rotation shaft 10, horizontal supports 12 extending from four radially outer portions of base portion 11, respectively, an annular horizontal piece 13 coupled to ends of horizontal supports 12, first support columns 14 extending upward from four portions of annular horizontal piece 13, respectively, and a pair of positioning pins 15 projecting from the top of each first support column 14 for holding a corner of substrate G. Second support columns 16 protrude from four positions of annular horizontal piece 13 that are angularly spaced from first support columns 14 by about 45 degrees, respectively. Rotary base 2 is coupled to a rotary drive unit 17 such as a motor via rotation shaft 10, and can rotate at a predetermined rotation speed around rotation shaft 10.

Approach stage 3 has a thin plate-like form that is circular when viewed from an upper side as shown in FIG. 2, and is provided at its center with a rectangular opening 3a for accommodating substrate G. Owing to this circular configuration of approach stage 3, it is possible to prevent formation of a turbulence near the outer periphery of approach stage 3 that is rotating. In this structure, approach stage 3 is fixed at the same level as the surface of substrate G or at a level slightly higher than it by, e.g., about 200 to 400 microns. This structure can form a liquid film that extends continuously on the same plane over the surface of substrate G and the surface of approach stage 3. Opening 3a of approach stage 3 is slightly larger than substrate G, and a space 9 is formed between substrate G held on substrate holding table 4 and approach stage 3 for transferring substrate G.

Figure 5:
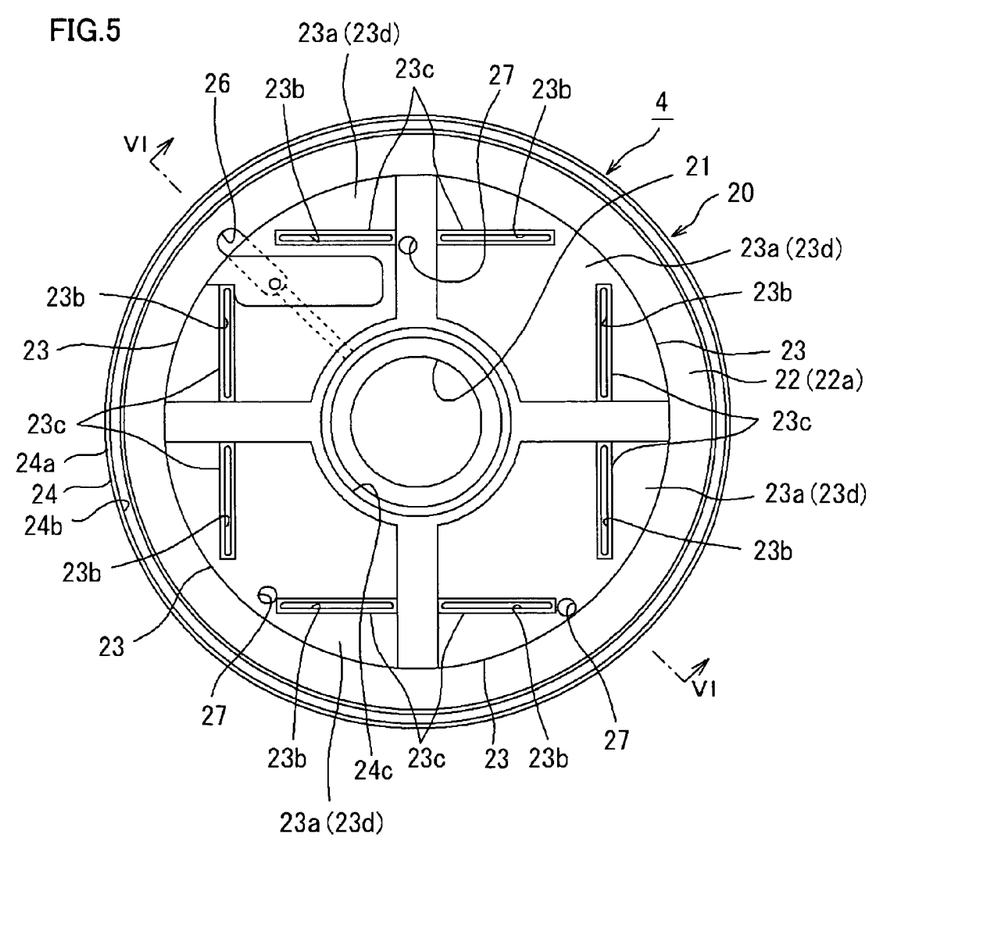
FIG. 5 is a plan showing the substrate holding table in the invention.
Figure 6:
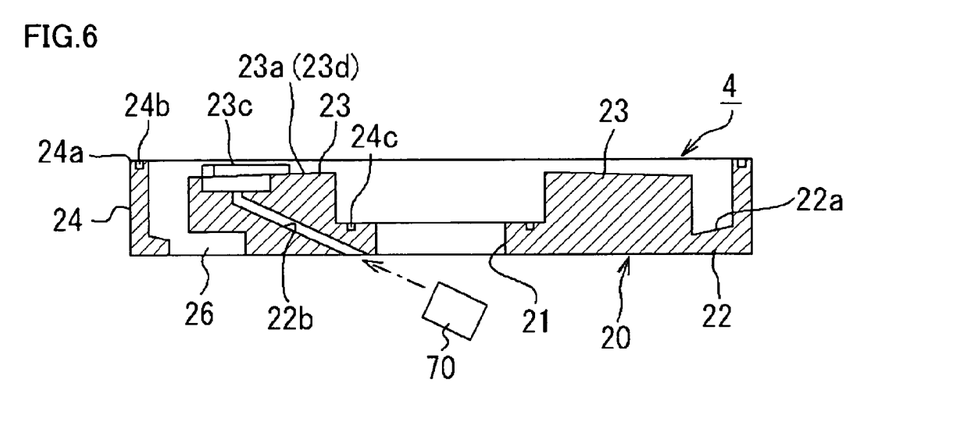
FIG. 6 is a cross section taken along line VI-VI in FIG. 5.

As shown in FIGS. 5 and 6, substrate holding table 4 includes an end-closed cylindrical body 20 having a through hole 21 through which rotation shaft 10 of rotary base 2 rotatably extends, and a suction holding unit 23 that protrudes upward from a bottom 22 of body 20 and has suction ports 23b for drawing substrate G onto its top surface 23a. A first circumferential groove 24b for engagement with a first annular seal member 25a to be described later is formed at a top surface 24a of a cylindrical side wall 24 of body 20. A second circumferential groove 24c for engagement with a second annular seal member 25b to be described later is formed at an edge around through hole 21 in bottom 22 of body 20. Substrate holding table 4 can be moved vertically with respect to rotary base 2 by a vertical drive mechanism 4A such as a cylinder, a motor mechanism or the like.

First annular seal member 25a fitted into first circumferential groove 24b of substrate holding table 4 can be in intimate contact with the rear surface of approach stage 3 throughout its circumference, and second annular seal member 25b fitted into second circumferential groove 24c can be in intimate contact with the rear surface of rotary base 2 throughout its circumference.

Figure 8A:
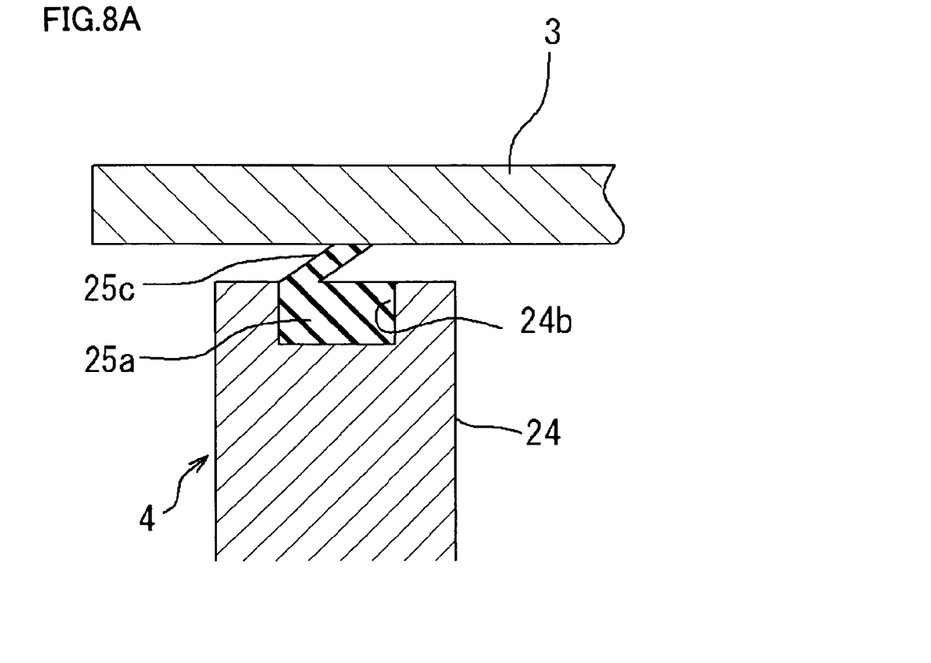
FIGS. 8A and 8B are cross sections showing first and second annular seal members in the invention, respectively.
Figure 8B:
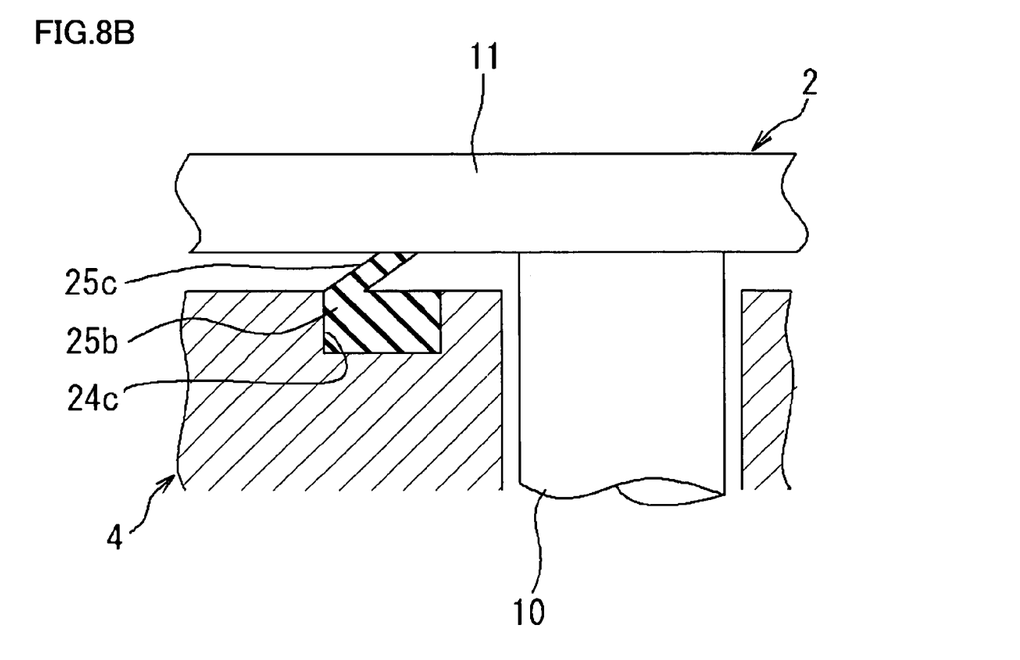

In this case, first and second annular seal members 25a and 25b are made of, e.g., flexible resin such as PCTFE (polychloro-trifluoroethylene) or PTFE (polytetrafluoroethylene), or rubber material having good resistance to chemicals and containing, e.g., silicon, and each includes a flexible seal piece 25c obliquely extending toward the contact target, i.e., the rear surface of approach stage 3 or the rear surface of rotary base 2. As described above, first and second annular seal members 25a and 25b are provided with flexible seal pieces 25c that extend obliquely toward the rear sides of approach stage 3 and rotary base 2, respectively, so that contact areas with respect to the rear surfaces of approach stage 3 and rotary base 2 can be large, and adjustment can be performed easily.

Figure 7A:
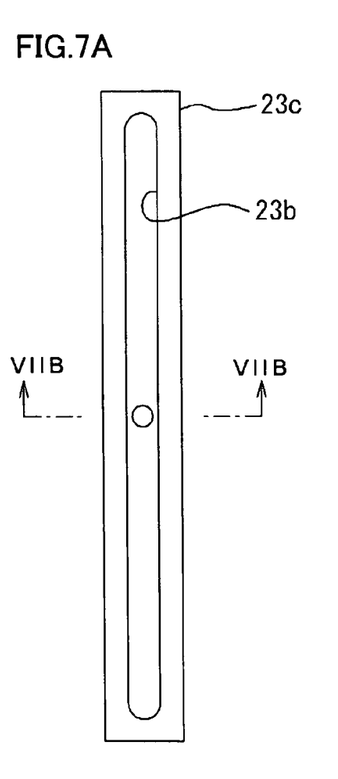
FIGS. 7A and 7B are a plan showing a suction holding unit of the substrate holding table in the invention and an enlarged cross section taken along line VIIB-VIIB in FIG. 7A, respectively.
Figure 7B:
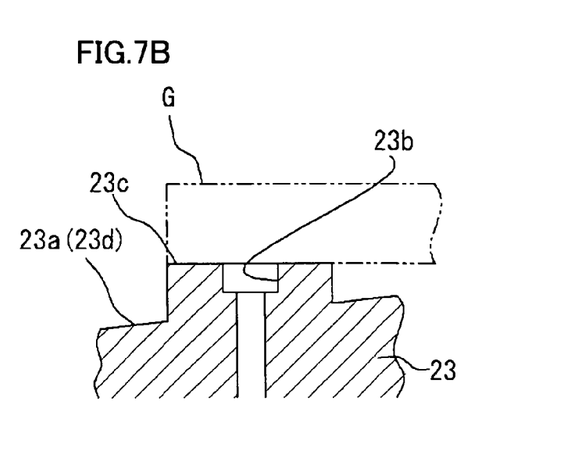

As shown in FIGS. 7A and 7B, suction holding unit 23 described above is formed of circumferentially divided four portions for avoiding interference with four horizontal supports 12. Each divided portion of suction holding unit 23 is provided at its top surface 23a with two suction port forming portions 23c of a slit-like form extending along the corners of substrate G. Each suction port forming portion 23c has a horizontally flat form, and top surface 23a except for suction port forming portion 23c is formed of an inclined or tapered surface 23d that is inclined to diverge downward from inside edge toward outside edge. This structure can effectively drain off the liquid that tends to adhere to top surface 23a of suction holding unit 23.

Bottom 22 of substrate holding table 4 is provided at its one position with a drain port 26, and a bottom surface 22a of bottom 22 is inclined downward toward drain port 26. This structure can effectively drain off the liquid that tends to adhere to bottom surface 22a of bottom 22.

Substrate holding table 4 is provided at an appropriate position of bottom 22 with a passage 22b that passes a rinse liquid such as pure water injected from a back-rinse nozzle 70 (see FIG. 6).

Substrate holding table 4 having the above structure holds substrate G by suction. Also, substrate holding table 4 is in intimate contact with approach stage 3 with first annular seal member 25a interposed therebetween, and is in intimate contact with rotary base 2 with second annular seal member 25b interposed therebetween. Thereby, liquid storage space 7 is formed. Also, substrate G becomes rotatable together with rotary base 2 and approach stage 3 when the suction holding by substrate holding table 4 is released and the intimate contact with first and second annular seal members 25a and 25b is released. Therefore, rotary base 2 and approach stage 3 rotate without rotating substrate holding table 4 so that a required power of rotary drive unit 17 can be small.

Substrate holding table 4 has three vertical through holes 27 each located at a position that can avoid interference with rotary base 2 and corresponds to the outer peripheral portion of substrate G. A support pin 28 is vertically movably inserted into through hole 27 for supporting and vertically moving substrate G. Support pin 28 can be vertically moved by a vertical drive unit 29 such as a cylinder, and can be projected above rotary base 2 for transferring substrate G to or from rotary base 2.

Rotary base 2 and substrate holding table 4 are arranged in cup 6 that can receive and collect the liquid dispersing or dropping from substrate G. Cup 6 takes, e.g., a substantially rectangular cylindrical form having, e.g., a closed lower end and an open top upper end, and covers the radially outer sides and lower sides of rotary base 2 and substrate holding table 4. The lower surface of cup 6 is connected to a drain pipe 6a communicated with, e.g., a drain unit of a factory so that the liquid collected into cup 6 can be discharged externally from the development processing device.

As shown in FIG. 2, a first standby stage 61 is arranged on a negative side in a Y direction (i.e., left side in FIG. 2) of cup 6. At first standby stage 61, nozzle head 5 supplying and aspirating the liquid developer and washing liquid (rinse liquid) can be located during standby. Nozzle head 5 has a substantially rectangular parallelepiped form extending in an X direction and having a length, e.g., equal to or longer than a size of the side of substrate G. Nozzle head 5 is carried by a gate- or portal-like head arm 5b, and can be horizontally moved (i.e., can scan) from first standby stage 61 to at least a position near a positive end (right end in FIG. 2) in the Y direction of cup 6 by a horizontal moving mechanism 5c formed of, e.g., a ball screw coupled to head arm 5b and a drive motor for it. Further, nozzle head 5 can be moved vertically by a vertical drive mechanism (not shown) such as a cylinder attached to, e.g., head arm 5b.

Figure 3:
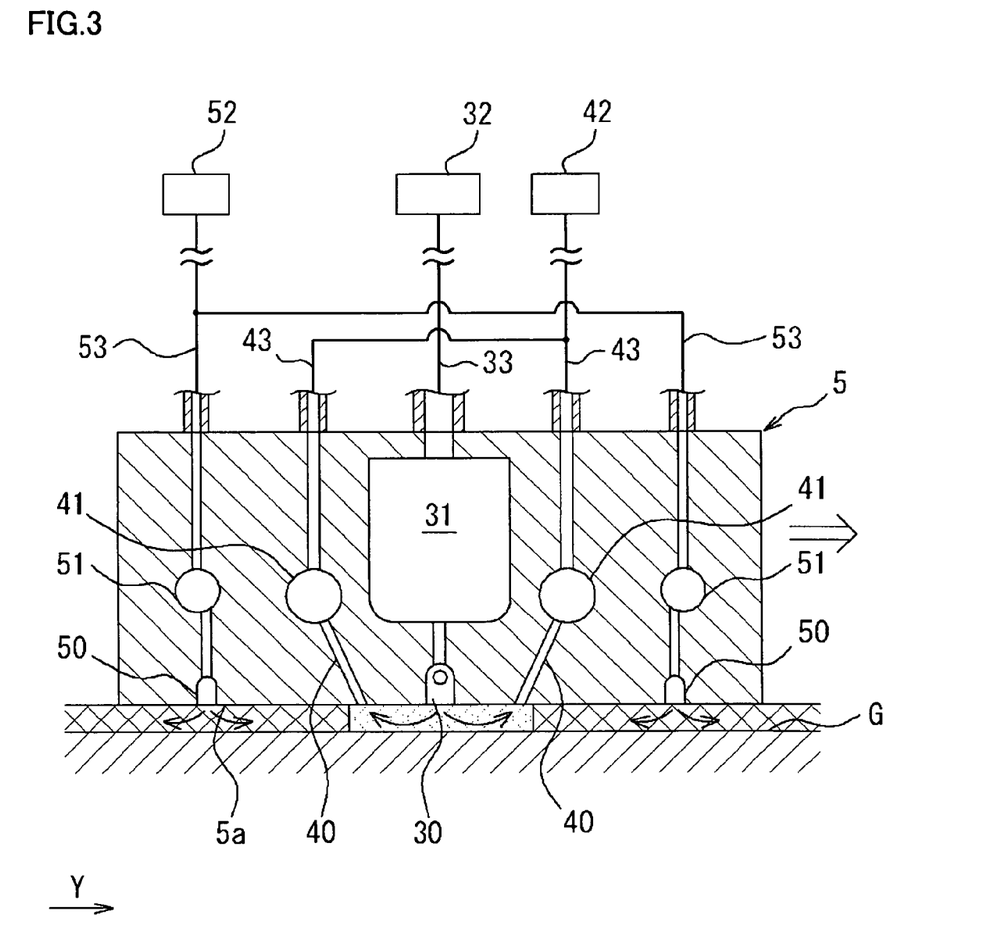
FIG. 3 is a cross section showing a nozzle head in the invention.

As shown in FIG. 3, a lower surface 5a of nozzle head 5 is horizontal and parallel to the surface of substrate G. Nozzle head 5 is provided at its lower surface 5a with a liquid developer discharge port 30 located at its central portion in the Y direction, i.e., a traveling direction of nozzle head 5. Liquid developer discharge port 30 has a slit-like form which extends in the longitudinal direction (X direction) of nozzle head 5 and is longer than, e.g., the side of substrate G, and can discharge the liquid developer in a belt-like form. Liquid developer discharge port 30 is communicated with a first storage unit 31, which is formed inside nozzle head 5 and is connected to a liquid developer supply source 32 arranged outside the development processing device through a liquid developer supply pipe 33. Liquid developer supply source 32 can supply the liquid developer at a predetermined flow rate to nozzle head 5 through developer supply pipe 33. Nozzle head 5 can temporarily store the supplied liquid developer in first storage unit 31 for pressure regulation, and then can uniformly discharge the liquid developer from liquid developer discharge port 30.

Nozzle head 5 is provided at its lower surface 5*a* with liquid developer suction ports 40 located on the opposite sides of liquid developer discharge port 30 for aspirating the liquid developer on substrate G. Each liquid developer suction port 40 has, e.g., a slit-like form parallel to liquid developer discharge port 30. Liquid developer suction port 40 is communicated with a second storage unit 41, which is formed, e.g., inside nozzle head 5 and is connected via a suction pipe 43 to a suction device 42 arranged outside development processing device. Suction device 42 can perform suction with a predetermined pressure through suction pipe 43. Consequently, a flow of the liquid developer from liquid developer discharge port 30 toward liquid developer suction port 40 can be formed on the surface of substrate G.

Nozzle head 5 is further provided at its lower surface 5*a* with rinse liquid discharge ports 50 located on the outer side of respective liquid developer suction ports 40 for discharging the rinse liquid such as pure water. Each rinse liquid discharge port 50 has a slit-like form parallel to, e.g., liquid developer discharge port 30, and can discharge the rinse liquid in a belt-like form extending in the X direction. Rinse liquid discharge port 50 is communicated with a third storage unit 51 formed inside nozzle head 5, and is connected via a rinse liquid supply pipe 53 to a rinse liquid supply source 52 arranged outside development processing device. Rinse liquid supply source 52 can supply the rinse liquid at a predetermined flow rate to nozzle head 5 through rinse liquid supply pipe 53. Nozzle head 5 can temporarily stored the supplied rinse liquid in third storage unit 51 for pressure regulation, and then can uniformly discharge the rinse liquid from rinse liquid discharge port 50.

As shown in FIG. 2, a second standby stage 62 is arranged on a positive side in the Y direction of cup 6. At second standby stage 62, rinse liquid discharge nozzle 8 that is the washing liquid supply device (and will be referred to as "rinse nozzle 8" hereinafter) can be located during standby. Rinse nozzle 8 is carried by an end of a nozzle arm 8*b* attached to, e.g., a rotary drive shaft 8*a*, and can move from second standby stage 62 to a position above the center of substrate G within cup 6 according to the rotation of rotary drive shaft 8*a*. Rinse nozzle 8 is connected to a rinse liquid supply source 63 arranged, e.g., outside development processing device through a rinse liquid supply pipe 64, and can discharge downward the rinse liquid (pure water) supplied from rinse liquid supply source 63.

Development processing of the development processing device having the above structure will now be described with reference to illustrations of FIGS. 9A-9I and a flowchart of FIG. 10.

Figure 9A:
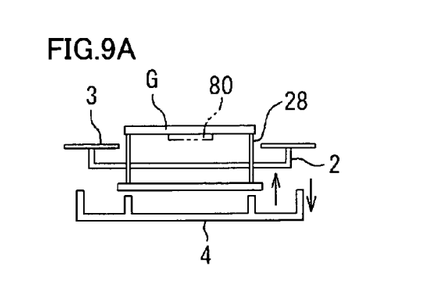
FIGS. 9A-9I are schematic cross sections showing processing steps of the development processing device according to the invention.
Figure 9B:
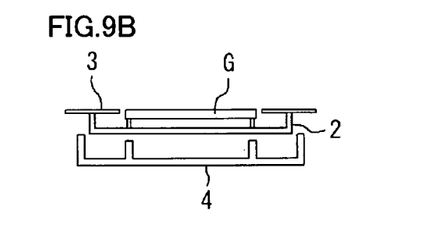
Figure 9C:
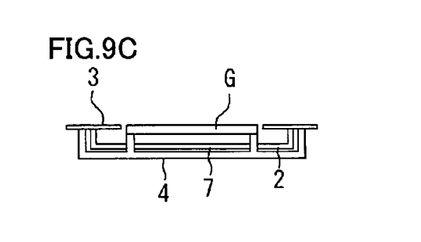
Figure 9D:
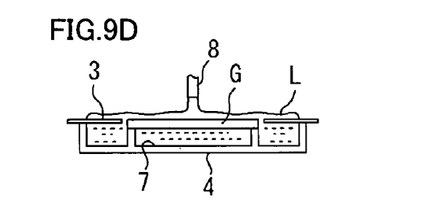
Figure 10:
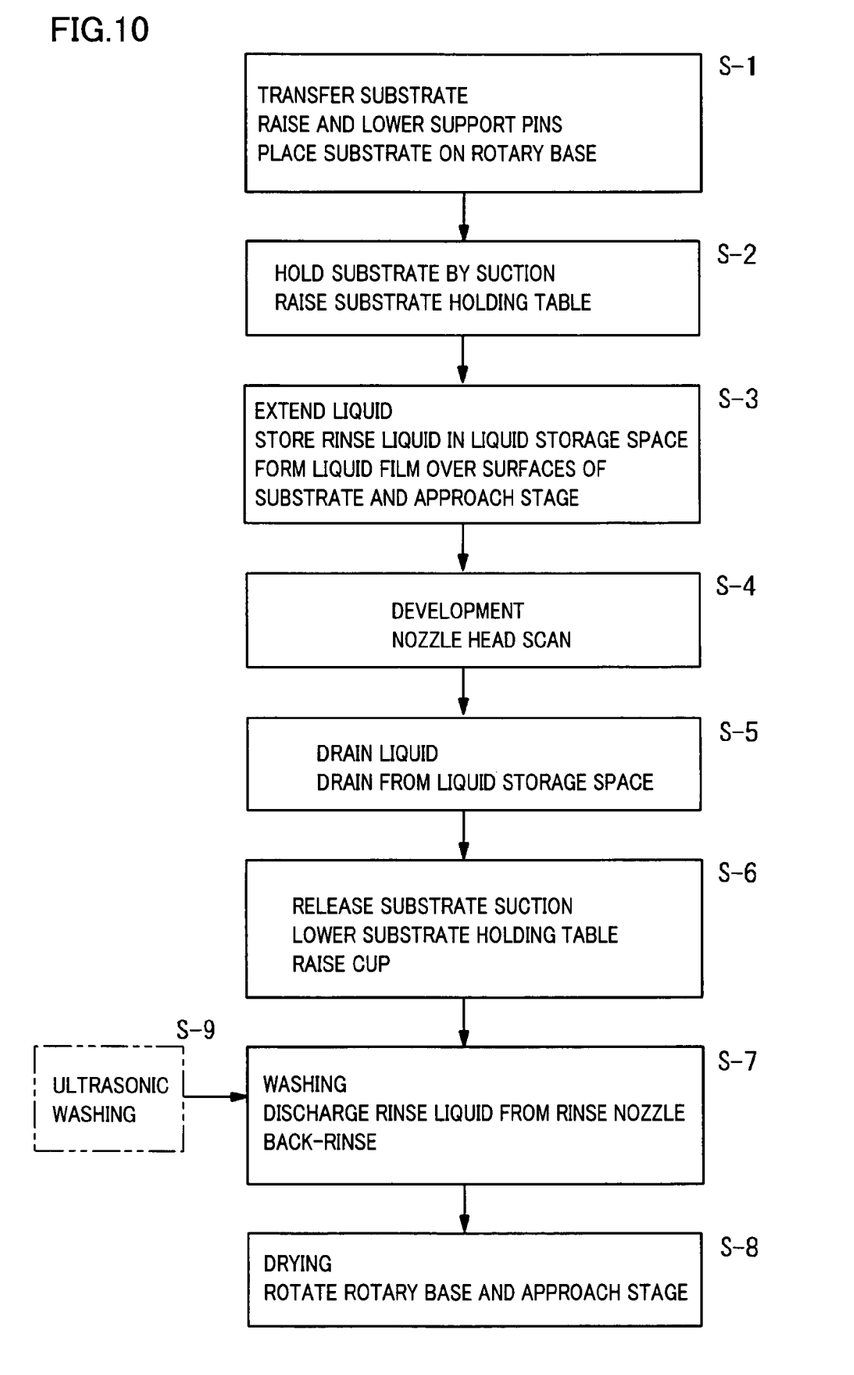
FIG. 10 is a flowchart showing the processing steps of the development processing device according to the invention.

When a transport arm 80 outside the development processing device transports substrate G to the development processing device, support pins 28 that are already raised receives substrate G, and then lowers to place substrate G on rotary base 2, and positioning pins 15 positions substrate G (S-1; see FIGS. 9A and 9B).

Then, substrate holding table 4 rises to hold substrate G by suction applied from suction holding unit 23 that is in contact with the rear surface of substrate G. Also, substrate holding table 4 comes into intimate contact with approach stage 3 with first annular seal member 25*a* interposed therebetween, and also comes into intimate contact with rotary base 2 with second annular seal member 25*b* interposed therebetween to form liquid storage space 7 (S-2; see FIG. 9C). In this state, rinse nozzle 8 moves to a position above the center of substrate G, and discharges pure water downward so that the rinse liquid (pure water) is stored in liquid storage space 7, and a liquid film L is formed over the surfaces of substrate G and approach stage 3 (S-3; see FIG. 9D). In this manner, pre-wetting processing is performed for improving wettability of the surface of substrate G. After the liquid film formation, rinse nozzle 8 returns to second standby stage 62.

Then, nozzle head 5 at first standby stage 61 moves to a position above approach stage 3 located on the negative side in the Y direction with respect to substrate G, and lower surface 5*a* having rinse liquid discharge ports 50, liquid developer discharge port 30 and liquid developer suction ports 40 of nozzle head 5 is located above approach stage 3. Then, nozzle head 5 lowers to a start position adjacent to the surface of approach stage 3. Then, nozzle head 5 moves positively in the Y direction (S-4; see FIG. 9E). During this movement, rinse liquid discharge ports 50 discharge the rinse liquid, liquid developer discharge port 30 discharges the liquid developer and liquid developer suction ports 40 aspirate the rinse liquid and the liquid developer thus discharged. In the above operation, the space between lower surface 5*a* of nozzle head 5 and the surface of approach stage 3 is always filled with the rinse liquid and the liquid developer, and movement of bubbles onto lower surface 5*a* of nozzle head 5 is prevented. When nozzle head 5 is moving positively in the Y direction over the surface of substrate G, the liquid developer discharged from liquid developer discharge port 30 onto substrate G is drawn to liquid developer suction ports 40 located on the forward and rearward sides in the traveling direction of nozzle head 5, and a flow of the liquid developer in a belt-like form is formed on a partial region of the surface of substrate G. The surface of substrate G is developed by this flow of the liquid developer. Liquid developer suction ports 40 immediately discharge dissolution products produced by the development.

Figure 9E:
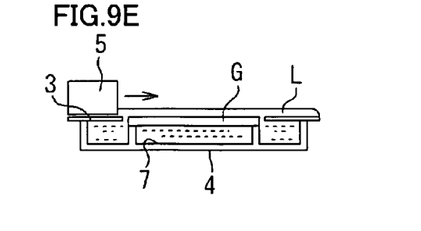

Nozzle head 5 moves (i.e., scans) to a position near the end on the positive side in the Y direction of approach stage 3, e.g., while continuously supplying and aspirating the liquid developer. Thereby, the region where the flow of liquid developer occurs gradually moves, and the development is performed throughout the surface of substrate G. When nozzle head 5 moves to the position near the end on the positive side in the Y direction of approach stage 3, the supply and aspiration of the liquid developer and rinse liquid stop, and nozzle head 5 returns to first standby stage 61.

Figure 9F:
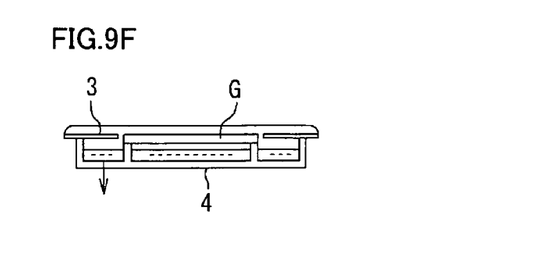
Figure 9G:
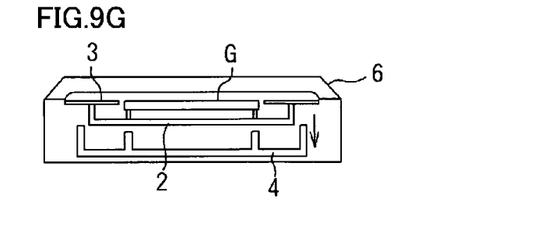
Figure 9H:
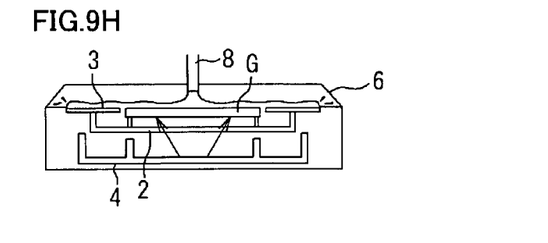

After the development processing ends as described above, the liquid (a mixture of the liquid developer and the rinse liquid) stored in liquid storage space 7 is externally discharged through drain port 26 (S-5; see FIG. 9F). Then, substrate holding table 4 releases the suction holding, and lowers to release the intimate contact thereof with respect to approach stage 3 and rotary base 2 (S-6; see FIG. 9G).

Then, rinse nozzle 8 that has been waiting at second standby stage 62 moves to a position above the center of substrate G, and rotary base 2 rotates substrate G together with approach stage 3. Rinse nozzle 8 discharges the rinse liquid onto rotating substrate G to wash it (S-7; see FIG. 9H). In this operation, the washing liquid may be supplied, e.g., from back-rinse nozzle 70 onto the rear surface of substrate G. In this washing processing, rotary base 2 and approach stage 3 are not in contact with substrate holding table 4 so that the portion of the rear surface of substrate G that was in contact with suction holding unit 23 can be washed.

Figure 9I:
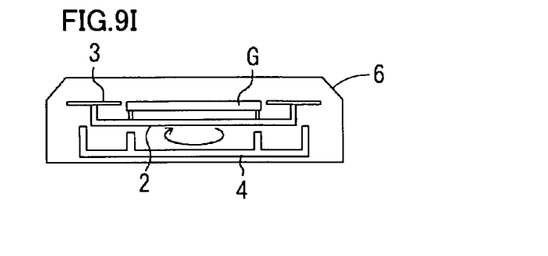

After substrate G is washed for a predetermined time as described above, substrate G is rotated fast to become dry (S-8; FIG. 9I).

When substrate G is dried, support pins 28 rise again to lift substrate G, and transport arm 80 outside the development processing device transports substrate G externally from the substrate processing device.

According to the embodiment described above, liquid storage space 7 stores the liquid, and the continuous liquid film is formed over the surfaces of substrate G and approach stage 3. Therefore, entry or mixing of bubbles into the liquid developer can be prevented when nozzle head 5 is supplying and aspirating the liquid developer.

Also, the development processing is performed while liquid storage space 7 is filled with the liquid. Therefore, it is possible to prevent such a situation that the liquid on substrate G moves around onto the rear side of substrate G.

Further, substrate holding table 4 can be spaced from substrate G and approach stage 3 during the washing processing. Therefore, it is possible to wash the portion of the rear surface of substrate G that was in intimate contact with suction holding unit 23. Consequently, it is possible to prevent remaining of an unwashed portion in the rear surface of substrate G and contamination of the substrate. Further, the suction line and the sealing unit can have simple structures, and the required drive power can be small.

Figure 11:
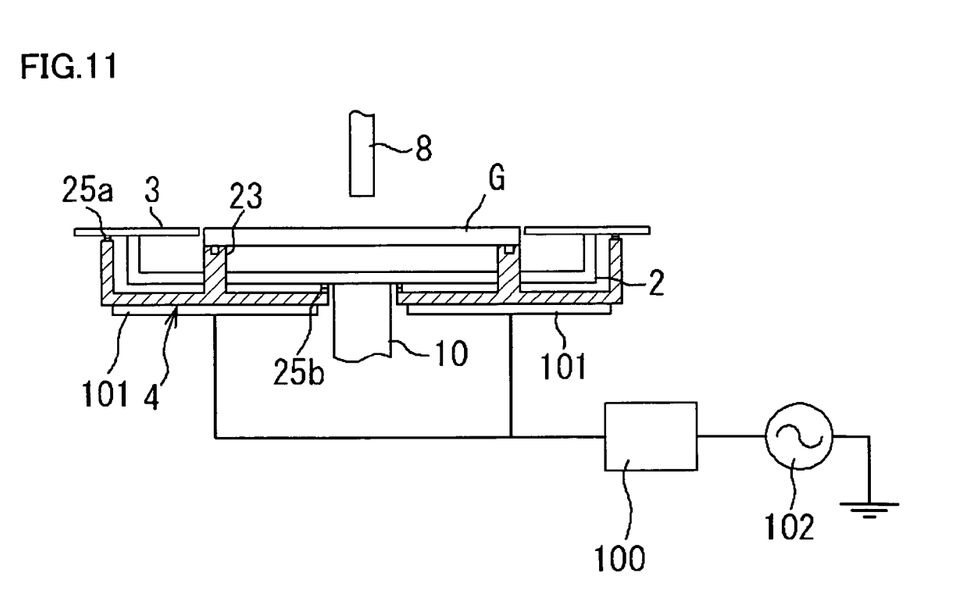
FIG. 11 is a schematic cross section showing a major portion of a second embodiment of the development processing device according to the invention.

In the above embodiment already described, the rinse liquid is discharged from rinse nozzle 8 onto the surface of substrate G, and back-rinse nozzle 70 discharges the rinse liquid toward the rear surface of substrate G. However, the washing processing may be performed in another method. FIG. 11 shows an example thereof. In this structure, a vibrator 101 is arranged on the lower surface of bottom 22 forming liquid storage space 7 of substrate holding table 4, and is connected to an ultrasonic generator 100 connected to an ultrasonic drive power supply 102. In this structure, ultrasonic generator 100 applies a radio-frequency voltage of an appropriate frequency to vibrator 101 to excite it so that ultrasonic vibrations occur and propagate through the liquid stored in liquid storage space 7 to remove liquid developer adhering to the rear surface of substrate G (see S-9 in FIG. 10).

In the second embodiment shown in FIG. 11, other structures are the same as those in the first embodiment. The same portions bear the same reference numbers, and description thereof is not repeated.

The invention can be applied to rectangular substrates for reticles, LCDs and FPDs (Flat Panel Displays) as well as circular substrates such as wafers and other plates.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A development processing device comprising:
a rotary base rotatably holding a work substrate;
an outer peripheral plate arranged for rotation together with said rotary base and surrounding an outer periphery of said work substrate held by said rotary base;
a substrate holding table arranged vertically movably with respect to said rotary base for holding said work substrate by suction; and
a nozzle head arranged movably along a surface of said work substrate held by said substrate holding table for simultaneously performing supply and aspiration of a liquid developer with respect to the work substrate, wherein
a top surface of said outer peripheral plate is flush with or slightly higher in level than a top surface of said work substrate,
when said substrate holding table is holding said work substrate by suction, said substrate holding table is in intimate contact with said outer peripheral plate and said rotary base with a seal member interposed therebetween such that a liquid storage space is formed for forming a liquid film continuously extending over the top surface of said outer peripheral plate and the top surface of said work substrate, and
when said suction holding and said intimate contact are released, said work substrate is rotatable together with said rotary base and said outer peripheral plate.

2. The development processing device according to claim 1, further comprising:
a washing liquid supply device supplying a washing liquid toward said rotary base, said work substrate held by said substrate holding table and said liquid storage space.

3. The development processing device according to claim 2, wherein
said substrate holding table includes:
a first annular seal member being intimately contactable with the rear surface of said outer peripheral plate throughout its circumference,
a second annular seal member being intimately contactable with the rear surface of said rotary base throughout its circumference, and
a suction holding unit making intimate contact with the rear surface of said work substrate and holding said work substrate by suction.

4. The development processing device according to claim 3, wherein
said first and second annular seal members have flexible seal pieces obliquely extending toward the intimate contact targets formed of the rear side of the outer peripheral plate and the rear side of the rotary base, respectively.

5. The development processing device according to claim 4, wherein
said substrate holding table includes:
a cylindrical body having a closed end and a through hole for rotatably inserting a rotation shaft of said rotary base, and
a suction holding unit projected from a bottom of said body, and having a suction hole at its top surface for draining the work substrate by suction,
the first annular seal member is arranged on a top surface of a side wall of said body, and
the second annular seal member is arranged on an edge of said through hole at the bottom of said body.

6. The development processing device according to claim 3, wherein
said substrate holding table includes:
a cylindrical body having a closed end and a through hole for rotatably inserting a rotation shaft of said rotary base, and
a suction holding unit projected from a bottom of said body, and having a suction hole at its top surface for draining the work substrate by suction,
the first annular seal member is arranged on a top surface of a side wall of said body, and
the second annular seal member is arranged on an edge of said through hole at the bottom of said body.

7. The development processing device according to claim 2, wherein said substrate holding table includes:
a cylindrical body having a closed end and a through hole for rotatably inserting a rotation shaft of said rotary base, and
a suction holding unit projected from a bottom of said body, and having a suction hole at its top surface for draining the work substrate by suction,
a first annular seal member is arranged on a top surface of a side wall of said body, and
a second annular seal member is arranged on an edge of said through hole at the bottom of said body.

8. The development processing device according to claim 7, wherein
a suction port forming portion of said suction holding unit is horizontally flat, and a top surface of said suction holding unit except for said suction port forming portion is inclined to diverge downward from inside toward outside in a radial direction of said substrate holding table.

9. The development processing device according to claim 2, wherein
said substrate holding table is provided at its bottom with a drain port, and a bottom surface of said substrate holding table is inclined downward toward said drain port.

10. The development processing device according to claim 2, wherein
a vibrator is arranged on a lower surface of a bottom defining the liquid storage space of said substrate holding table, and an ultrasonic generator is connected to said vibrator.

11. The development processing device according to claim 1, wherein
said substrate holding table includes:
a first annular seal member being intimately contactable with the rear surface of said outer peripheral plate throughout its circumference,
a second annular seal member being intimately contactable with the rear surface of said rotary base throughout its circumference, and
a suction holding unit making intimate contact with the rear surface of said work substrate and holding said work substrate by suction.

12. The development processing device according to claim 11, wherein
said first and second annular seal members have flexible seal pieces obliquely extending toward the intimate contact targets formed of the rear side of the outer peripheral plate and the rear side of the rotary base, respectively.

13. The development processing device according to claim 12, wherein
said substrate holding table includes:
a cylindrical body having a closed end and a through hole for rotatably inserting a rotation shaft of said rotary base, and
a suction holding unit projected from a bottom of said body, and having a suction hole at its top surface for draining the work substrate by suction,
the first annular seal member is arranged on a top surface of a side wall of said body, and
the second annular seal member is arranged on an edge of said through hole at the bottom of said body.

14. The development processing device according to claim 11, wherein
said substrate holding table includes:
a cylindrical body having a closed end and a through hole for rotatably inserting a rotation shaft of said rotary base, and
a suction holding unit projected from a bottom of said body, and having a suction hole at its top surface for draining the work substrate by suction,
the first annular seal member is arranged on a top surface of a side wall of said body, and
the second annular seal member is arranged on an edge of said through hole at the bottom of said body.

15. The development processing device according to claim 11, wherein
said substrate holding table is provided at its bottom with a drain port, and a bottom surface of said substrate holding table is inclined downward toward said drain port.

16. The development processing device according to claim 11, wherein
a vibrator is arranged on a lower surface of a bottom defining the liquid storage space of said substrate holding table, and an ultrasonic generator is connected to said vibrator.

17. The development processing device according to claim 1, wherein
said substrate holding table includes:
a cylindrical body having a closed end and a through hole for rotatably inserting a rotation shaft of said rotary base, and
a suction holding unit projected from a bottom of said body, and having a suction hole at its top surface for draining the work substrate by suction,
a first annular seal member is arranged on a top surface of a side wall of said body, and
a second annular seal member is arranged on an edge of said through hole at the bottom of said body.

18. The development processing device according to claim 17, wherein
a suction port forming portion of said suction holding unit is horizontally flat, and a top surface of said suction holding unit except for said suction port forming portion is inclined to diverge downward from inside toward outside in a radial direction of said substrate holding table.

19. The development processing device according to claim 1, wherein
said substrate holding table is provided at its bottom with a drain port, and a bottom surface of said substrate holding table is inclined downward toward said drain port.

20. The development processing device according to claim 1, wherein
a vibrator is arranged on a lower surface of a bottom defining the liquid storage space of said substrate holding table, and an ultrasonic generator is connected to said vibrator.

* * * * *